United States Patent [19]

d'Auria et al.

[11] 4,103,154
[45] Jul. 25, 1978

[54] ELECTRO-OPTICAL BRANCHING DEVICE AND METHOD OF MANUFACTURING THE SAME

[75] Inventors: Luigi d'Auria; André Jacques; Philippe Maillot, all of Paris, France

[73] Assignee: Thomson-CSF, Paris, France

[21] Appl. No.: 762,509

[22] Filed: Jan. 26, 1977

[30] Foreign Application Priority Data

Jan. 27, 1976 [FR] France .................. 76 02191

[51] Int. Cl.² .................................................. G02B 5/14
[52] U.S. Cl. ...................................... 250/227; 250/551; 350/96.15; 350/356; 350/96.22; 350/343
[58] Field of Search .................. 250/227, 551, 239; 350/96 C, 96 B; 357/19

[56] References Cited

U.S. PATENT DOCUMENTS

| 3,790,791 | 2/1974 | Anderson | 250/551 |
| 3,931,518 | 1/1976 | Miller | 350/96 C |
| 3,982,123 | 9/1976 | Goell et al. | 250/227 |
| 4,021,097 | 5/1977 | McMahon | 350/96 C |

*Primary Examiner*—David C. Nelms
*Attorney, Agent, or Firm*—Cushman, Darby & Cushman

[57] ABSTRACT

The invention relates to optical communications by bundles of optical fibres. More particularly, the invention relates to a branching fiber optic connector device for optically and mechanically connecting two bundles of optical fibres with a single optical fibre and for supplying an electrical signal characteristic of the incident optical energy obtained by extracting part of the radiation in said fibre by means of a photodiode sealed to said fibre after removal of the cladding over a surface corresponding to the detecting surface of the photodiode, the refractive index of the sealing material being higher than the refractive index of the cladding.

2 Claims, 5 Drawing Figures

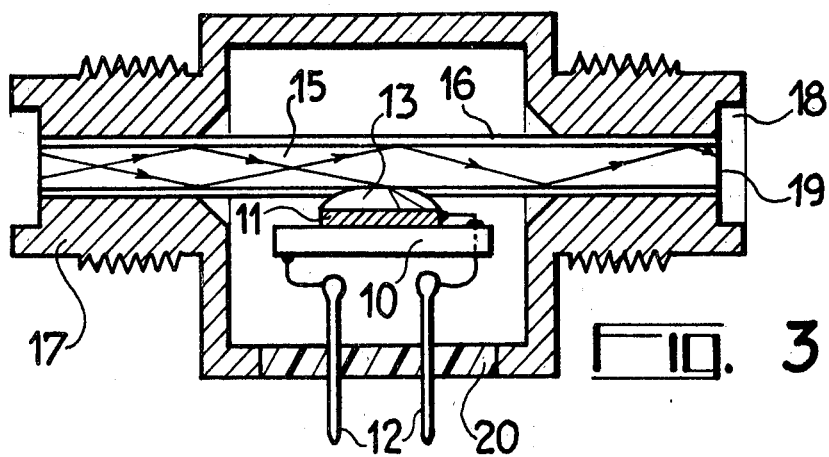
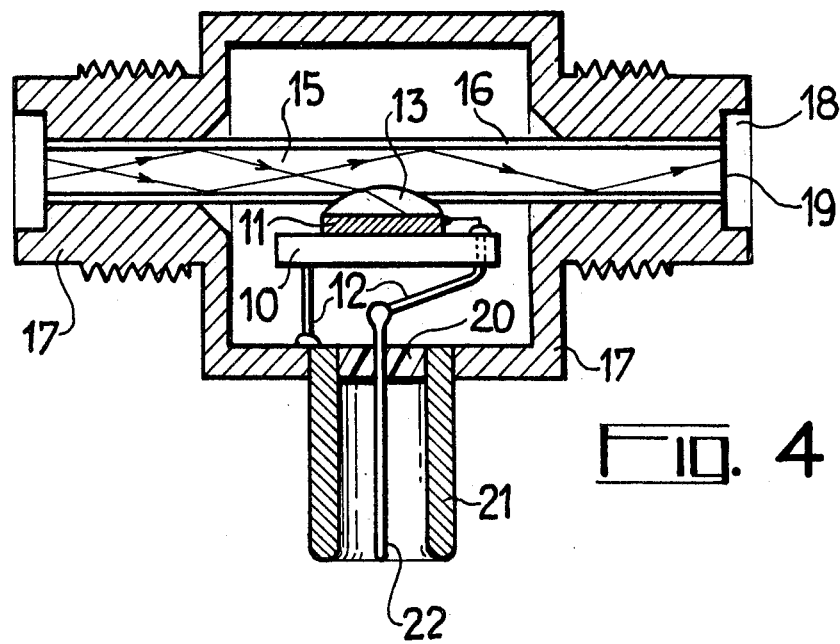

ELECTRO-OPTICAL BRANCHING DEVICE AND METHOD OF MANUFACTURING THE SAME

This invention relates to the field of optical communication by bundles of optical fibres and, more particularly, to the branches enabling part of the signal transmitted in an optical communication line made of bundles of optical fibres to be extracted. In general, known branches for linking such as these are purely optical branches obtained, for example, by materially dividing the bundle of fibres into at least two parts, in which case the radiation remains guided by the fibres, or by treating the optical radiation emerging from a bundle of fibres by conventional optical means using a partially reflecting plate, refractive elements, a prism, a plate with a parallel surface or any other means capable of dividing the radiation emerging from the bundle of optical fibres. The optical beams emanating from this division have to be picked up again by fibres for the rest of the transmission.

The present invention provides a more direct solution to the problem of extracting part of the signal circulating in an optical communications line, this extraction being particularly useful in cases where it is intended to connect a single transmitter to several receivers distributed along the line. The extracted signal is delivered in electrical form.

In accordance with the present invention there is provided an electro-optical branching device for picking up a fraction of optical radiation and converting the latter into an electrical signal, said device comprising an optical inlet for receiving said optical radiation, an optical outlet for transmitting said optical radiation, a single optical fibre having two ends respectively at said optical inlet and outlet for conveying said optical radiation, and a photodetector element optically coupled to the core of said single optical fiber; the cladding of said core having an opening facing the sensitive area of said photodetector element; the gap separating the portion of said core exposed through said opening from said sensitive area being filled with a sealing material transmitting said fraction of optical radiation; the refractive index of said sealing material being higher than that of said cladding.

The invention will be better understood and other features thereof will become apparent from the following description in conjunction with the accompanying drawings, wherein:

FIG. 1 diagrammatically illustrates a "T-form" electrooptical structure according to the invention comprising one optical input and two outputs, one optical and the other electrical.

FIGS. 3 and 4 are sections through more particular embodiments of the invention.

Figure 1:
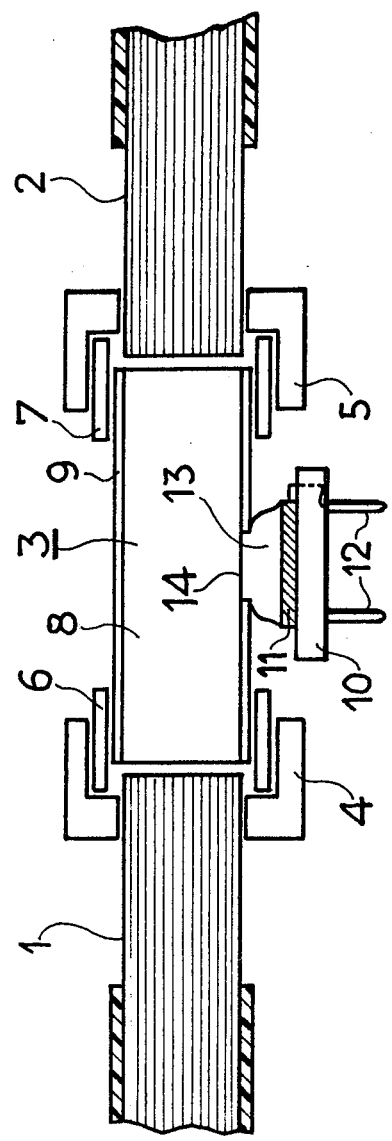

FIG. 1 shows two bundles of optical fibres 1 and 2 which are optically connected by a single optical fibre 3 substantially equal in its cross-section to the cross-section of the bundles, the mechanical connection being established by means of female ferrules 4 and 5 respectively disposed at the ends of the bundles 1 and 2 to be connected and male ferrules 6 and 7 disposed at the two ends of the single fibre establishing the optical connection. These various ferrules, which are shown in section, are bodies of revolution. The fibre 3 comprises a core 8 and a cladding 9 with respective indices $n_1$ and $n_2$, $n_1$ being greater than $n_2$, so that the light rays impinging on the interface between the core and the cladding are totally reflected towards the core.

A window is formed in the cladding 9, the surface area of this window being determined by the amount of optical energy to be diverted. A conventional photodiode comprises a base seat 10 surmounted by a photodetector pellet 11 determining the light-detecting surface. The base seat 10 carries two electrical pins 12 welded to the two contacts of the photodiode. A drop of a transparent sealing compound 13, of which the refractive index $n_0$ is greater than the index $n_2$ of the cladding of the single fibre 3, is deposited onto the detecting surface and the whole is sealed to the single fibre at the level of the window 14 formed in the cladding of the fibre.

The method by which this window 14 is formed consists in removing part of the cladding of the optical fibre by abrasion. By rubbing the cladding with a cylinder, it is thus possible to obtain a substantially elliptical opening. That part of the core which is thus exposed is then polished. Accordingly, a fraction of the radiation which impinges on the interface between the core of the fibre and the sealing material is transmitted by that material to the detecting surface 11 of the photodiode. The greater the surface area of the opening formed in the cladding which is occupied by the sealing material, the greater the detected fraction of the incident radiation will be. In addition, it is known that $n_2$ is lower than $n_1$ and that the incidence angles of the rays on the interface between the core and the cladding are comprised between a minimum value $i_{min}$ and $\rho/2$ so that they are reflected at that interface.

If $n_0$ is higher than $n_1$, all the rays impinging on the interface between the core and the sealing material are refracted and hence transmitted to the detecting surface of the photodiode. If $n_0$ is lower than $n_1$, only those rays which have an incidence angle comprised between 0 and a maximum value $i_{max}$ are capable of being refracted. Since the incidence angles are comprised between $i_{min}$ and $\rho/2$ so that at least a fraction of the radiation impinging on the interface between the core and the sealing product is transmitted to the photodiode, $i_{max}$ must be greater than $i_{min}$, in other words $n_0$ must be greater than $n_2$, as indicated above. The fraction of the radiation transmitted to the photodiode is thus maximal when $n_0 \geq n_1$ and decreases to 0 when $n_0$ varies from $n_1$ to $n_2$.

Figure 2A:
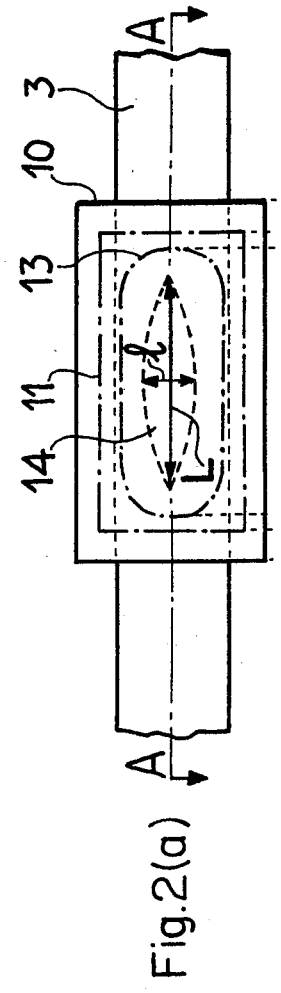
FIGS. 2a and 2b illustrate one embodiment of the structure of an optical connecting device comprising an electrical branch according to the invention.
Figure 2B:
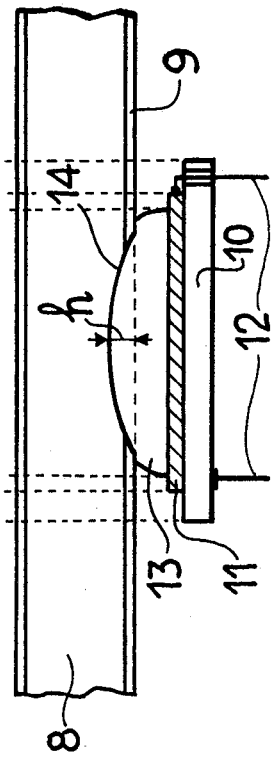

FIG. 2 is a more detailed view of the optical fibre and the branch. FIG. 2 shows at (a) a plan view and at (b) a section on the line A shown at (a). The same elements as in FIG. 1 are denoted by the same reference numerals.

Assuming, for example, that the length of the fibre 3 is 17 mm, its diameter is 560 μm, the thickness of the cladding is equal to a few μm, the numerical aperture of the fibre is 0.55 and the respective indices of the core and cladding are 1.620 and 1.512, and that an opening of the type shown in FIG. 2 with a length L of 1 mm, a width 1 of 400 μm and a depth h of 86 μm has been formed, the core is sealed to a silicon photodiode having a surface area of 2.4 × 1.2 mm² with epoxy resin having a refractive index of 1.55. Experience has shown that the extracted optical energy detected corresponds to approximately 0.6% of the incident optical energy in the fibre. The sensivity of the photodiode at λ = 6328 A, λ being the wavelength of the optical radiation, being $\eta$ = 0.32 A/W, the coefficient of electro-optical transfer defined by $i/Pi$, $i$ being the photocurrent corresponding to the detection and $P_i$ being the incident optical power, is equal to 2.3 nA/μW. This transfer coefficient increases for the higher wave lengths (λ around 0.82 μm) normally used for transmission by optical fibres.

FIG. 3 is a section through an extraction device combined with a detachable connector having optical inlet and outlet intended to be connected to two bundles of optical fibres. This connection device is adapted for the production of a T-form electro-optical structure because it comprises a single fibre which optically connects the bundles and acts as a mixing fibre for the radiation emanating from all the fibres of the adjacent bundle. It comprises an optical fibre 15 with its cladding 16 inserted into a mechanical male connecting element 17 which is screw-threaded at its two ends intended for connection with complementary mechanical connecting elements into which bundles of fibres will be inserted. In FIG. 3, this metallic element comprises a lateral opening filled by an insulating sealing material 20 from which emerge the two connecting pins 12 of the electrical output channel of the Tee. Extraction is effected in the same way as before by means of a photodiode 11 carried by a support 10 and sealed to the core of the fibre with an epoxy resin 13 occupying an opening formed in the cladding.

A similar device intended to supply the electrical signal to a coaxial cable structure may also be produced. FIG. 4 shows the corresponding electrical connections mounted on an element similar to that shown in FIG. 3.

One of the electrical connections 12 is welded to an outer cylindrical conductor 21 which is in turn welded to the casing element 17. At the level of the element 17, the interior of the conductor 21 comprises a spacer of insulating sealing material 20 traversed by an inner conductor 22 which is connected to the second electrical connection 12.

An arrangement such as this may be used for producing T-form electro-optical structures of which the largest dimensions do not exceed 20 mm for a device intended to be connected to bundles of 61 fibres, the diameter of these bundles being of the order of 560 μm.

An extraction device of the type in question may be used for carrying out tests intended for checking sections of optical communications lines, the power extracted in that case being very low of the order of one nanowatt for a line intended to transmit a power of the order of one milliwatt. It may also be used for carrying out measurements at different points of an optical communication line, the power extracted and converted into electrical energy being directly related to the incident power. In this case, it is even sufficient to extract a small fraction of the optical radiation. Finally, it may be used in communication systems as the starting point of a negative feed back loop. The power extracted in that case may be fairly considerable so as to avoid significant amplification in the loop. Finally, for distributing information to a certain number of subscribers distributed along a line between a transmitter and a receiving terminal, a series of extraction devices may be installed each with a higher extraction level than the preceding device so that the subscribers receive substantially the same power.

The invention is by no means limited to the embodiments which have been described and illustrated. In particular, the opening formed in the cladding of the fibre and the opposite photodetective surface may assume other forms.

It would even be possible for the extraction device described above to be combined with a bundle end connector, for example with a transmitter, for measuring the power transmitted. However, it is preferable in this case to use other devices which utilise the radiation that is not picked up by the single fibre, for example the radiation emitted from the lateral surfaces of the emitting diode.

On the other hand, this may be contemplated at the level of an end connector comprising a receiver.

What we claim is:

1. An electro-optical branching device for picking up a fraction of optical radiation and converting the latter into an electrical signal, said device comprising a casing, a single optical fibre comprising an inner core and an outer cladding and having two ends, said outer cladding comprising a lateral opening, said casing surrounding said fibre and forming around said two ends mechanical connecting ferrules for connection to complementary ferrules, said device further comprising a photodetector element placed in said casing, said element having a sensitive area facing said opening and being fixed to said core through said opening by a sealing material to transmit said fraction of optical radiation; the refractive index of said sealing material being at least equal to that of said cladding.

2. An electro-optical branching device as claimed in claim 1, wherein said photodetector element is a silicon photodiode.

* * * * *